(12) United States Patent
Karim et al.

(10) Patent No.: US 7,968,899 B2
(45) Date of Patent: Jun. 28, 2011

(54) LED LIGHT SOURCE HAVING IMPROVED RESISTANCE TO THERMAL CYCLING

(75) Inventors: Norfidathul Aizar Abdul Karim, Seberang Prai (MY); Siew It Pang, Bayan Lepas (MY); Kheng Leng Tan, Bayan Lepas (MY); Tong Fatt Chew, Bayan Lepas (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 410 days.

(21) Appl. No.: 11/845,501

(22) Filed: Aug. 27, 2007

(65) Prior Publication Data
US 2009/0057708 A1 Mar. 5, 2009

(51) Int. Cl.
*H01L 33/00* (2010.01)
(52) U.S. Cl. .............. 257/98; 257/96; 257/97; 257/99; 257/100; 257/103; 257/E51.018; 257/E51.022; 257/E33.001; 257/E33.077; 257/E33.057; 438/22; 438/46; 438/47
(58) Field of Classification Search .............. 257/96, 257/97, 98, 99, 100, 101, 102, 103, E51.018, 257/E51.022, E33.001, E33.077, E33.057, 257/E25.028, E25.032; 438/22, 46, 47
See application file for complete search history.

(56) References Cited

U.S. PATENT DOCUMENTS

| 2004/0041222 | A1* | 3/2004 | Loh | 257/433 |
|---|---|---|---|---|
| 2005/0145991 | A1* | 7/2005 | Sakamoto et al. | 257/604 |
| 2005/0162069 | A1* | 7/2005 | Ota et al. | 313/501 |
| 2005/0269591 | A1* | 12/2005 | Hsin Chen et al. | 257/99 |
| 2006/0175716 | A1* | 8/2006 | Nakashima | 257/787 |
| 2006/0261366 | A1* | 11/2006 | Yang | 257/100 |
| 2007/0096128 | A1* | 5/2007 | Fukudome et al. | 257/98 |
| 2007/0262328 | A1* | 11/2007 | Bando | 257/79 |
| 2008/0073662 | A1* | 3/2008 | Wang et al. | 257/99 |

FOREIGN PATENT DOCUMENTS

| JP | 2005/259972 | 9/2005 |
|---|---|---|
| JP | 2007/070445 | 3/2007 |

* cited by examiner

*Primary Examiner* — Lynne A Gurley
*Assistant Examiner* — Yosef Gebreyesus

(57) ABSTRACT

A light source and method for making the same are disclosed. The light source includes a substrate, a die, and a cup. The substrate has a plurality of electrical traces thereon and the die includes an LED that is connected to two of the traces. The cup overlies the substrate and is filled with an encapsulant material. The die is located within the cup and is encapsulated by the substrate and the encapsulant material. The cup and encapsulant material have substantially the same coefficient of thermal expansion. The cup can include reflective sidewalls positioned to reflect light leaving the die. The cup, encapsulant and substrate can be constructed from the same material.

21 Claims, 2 Drawing Sheets

LED LIGHT SOURCE HAVING IMPROVED RESISTANCE TO THERMAL CYCLING

BACKGROUND OF THE INVENTION

Light-emitting diodes (LEDs) are good candidates to replace incandescent and other light sources. LEDs have higher power to light conversion efficiencies than incandescent lamps and longer lifetimes. In addition, LEDs operate at relatively low voltages, and hence, are better adapted for use in many battery-powered devices. Furthermore, LEDs are a better approximation to point sources than a fluorescent source, and hence, are better adapted than fluorescent sources for lighting systems in which a point light source that is collimated or focused by an optical system is required.

An LED can be viewed as a three-layer structure in which an active layer is sandwiched between p-type and n-type layers. Holes and electrons from the outer layers recombine in the active layer to produce light. Part of this light exits through the upper horizontal surface of the layered structure. Unfortunately, the materials from which the outer layers are constructed have relatively high indices of refraction compared to air or the plastic encapsulants used to protect the LEDs. As a result, a considerable portion of the light is trapped within the LED due to internal reflection between the outer boundaries of the LED. This light exits the LED through the side surfaces. To capture this light, the LEDs are often mounted in a reflecting cup whose sidewalls redirect the light from the sides of the LED into the forward direction. In addition, the cups are often filled with a clear encapsulant that protects the LED die and can provide additional optical functions such as having a surface that is molded to form a lens.

Unfortunately, the packages must be able to withstand relatively high processing temperatures. AuSn eutectic die attachment can subject the package to temperatures as high as 320 degrees centigrade. In addition, LEDs designed for high power applications generate significant amounts of heat that result in further temperature cycling of the package when the LEDs are turned on and off. As noted above, the cups are typically filled with an encapsulant. The encapsulant material is different from the material from which the reflector is formed. As a result, the encapsulant material and the material from which the reflector is formed typically have different coefficients of thermal expansion. In addition, the adhesion of the encapsulant to the reflector is often less than ideal. As a result, the encapsulant tends to delaminate from the cup after multiple thermal expansion cycles.

SUMMARY OF THE INVENTION

The present invention includes a light source and method for making the same. The light source includes a substrate, a die, and a cup. The substrate has a plurality of electrical traces thereon and the die includes an LED that is connected to two of the traces. The cup overlies the substrate and is filled with an encapsulant material. The die is located within the cup and is encapsulated by the substrate and the encapsulant material. The cup and encapsulant material are made of the same material base and have substantially the same coefficient of thermal expansion. The cup has reflective sidewalls positioned to reflect light leaving the die. The cup and the encapsulant can be constructed from the same material. In one aspect of the invention, the substrate is also constructed from the same encapsulating material. In another aspect of the invention, the substrate includes a lead frame that is encapsulated in a body and the cup is provided as a recess in that body.

DETAILED DESCRIPTION OF EMBODIMENTS OF THE INVENTION

Figure 1:
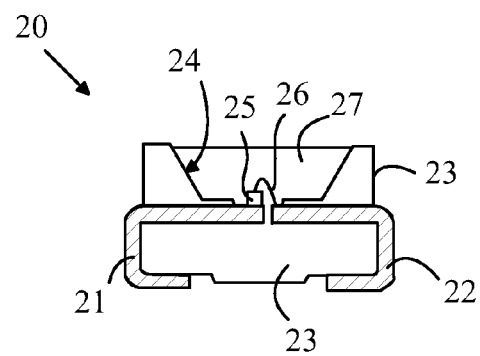
FIG. 1 is a cross-sectional view of one embodiment of a light source according to the present invention.

The manner in which the present invention provides its advantages can be more easily understood with respect to FIG. 1, which is a cross-sectional view of one embodiment of a light source according to the present invention. Light source 20 includes a die 25 having an LED fabricated thereon. The package includes a lead frame having leads 21 and 22 that are encapsulated in a molded body 23. Die 25 has two contacts for powering the LED. One of the contacts is on the bottom surface of die 25, and the other contact is on the top surface of die 25. Die 25 is connected electrically and thermally to lead 21 which provides the connection to the bottom contact as well as a heat path for the removal of heat generated in die 25. The contact on the top surface of die 25 is connected to lead 22 by wire bond 26.

The package includes a cup 24 having reflective walls which serve two functions. First, cup 24 redirects light leaving the side surfaces of die 25 so that the light leaves the light source within a cone of angles that includes the light that leaves the top surface of die 25. The material from which the cup is constructed can include particles such as $TiO_2$ that render the walls of cup 24 "white", and hence, provide a diffuse reflector.

Second, cup 24 provides a "mold" that is filled with a transparent medium 27 that, together with the lead frame encapsulates die 25 and wire bond 26. The encapsulant protects die 25 and wire bond 26 from moisture and other environmental attacks. In addition, the encapsulant improves the efficiency with which light is extracted from die 25. The material from which die 25 is constructed typically has a very large index of refraction. As a result, the difference in index of refraction between this material and air results in a significant fraction of the light generated in die 25 being trapped by internal reflection. Some of this trapped light eventually escapes through the side walls of the die after a number of reflections. However, a significant fraction is absorbed in die 25. By providing a medium having an index of refraction that is intermediate between that of air and the index of refraction of the materials from which die 25 is constructed, the encapsulant reduces the amount of light that is trapped by internal reflection. The encapsulant can be molded such that the top surface is curved. The curved surface further reduces the amount of light that is trapped within the light source due to differences in the index of refraction of the die and that of the surrounding air.

Finally, the encapsulant provides a carrier that can be used to provide a layer of wavelength converting material that alters the spectrum of light emitted by die 25 to provide a light source having a more desirable output spectrum. LEDs emit light in relatively narrow bands of wavelengths. While this narrow band emission is useful in applications in which a light source having a single color is required such as a red light source for the tail light of an automobile, in many applications of interest, a broadband light source is required. One method for broadening the output spectrum is to provide a phosphor that converts a portion of the light generated by the LED to light of a different color. The light source then has an output spectrum that is the sum of the phosphor emission spectrum and that of the LED itself. For example, a "white" LED can be constructed by providing a layer of phosphor that emits yellow light over an LED that emits blue light. The combination of blue and yellow light is perceived to be "white" light by a human observer. The phosphor particles are suspended in the encapsulant material while the material is in a liquid state. This slurry is then dispensed into cup 24 and cured in a time that is sufficiently short to prevent the settling of the particles out of the material.

Prior art light sources of the configuration shown in FIG. 1 utilize a base encapsulant material that is different from the material from which cup 24 is formed. The preferred encapsulants are epoxies or silicones. The cup is typically formed from a metal or some other plastic such as the plastic from which the body of the light source is molded. For example, the cup may be made of a liquid crystal polymer, while a first encapsulant layer covering the LED comprises a phosphor-filled epoxy while a second encapsulant layer comprises a transparent epoxy positioned over the first layer. The different materials have different coefficients of thermal expansion and different degrees of adhesion due to major differences in chemical composition. Hence, stress is induced at the interface of the two materials on the cup walls when the light source is subjected to heating and cooling. Such thermal cycling can result from the subsequent bonding of the completed light source to a substrate in a larger product that includes the light source. For example, infrared reflow soldering can subject the light source to high temperatures for short periods of time. In addition, as the power outputs of LED light sources are increased to provide power levels consistent with space lighting applications, the heat generated in the die can result in the light source reaching high enough temperatures that the light source is thermally cycled each time the source is turned on and off. As a result of such thermally induced stress, the encapsulant can separate from the walls of cup 24 and subject die 25 and wire bond 26 to forces that cause the light source to fail. In addition, such separation can lead to openings that allow moisture to reach die 25.

The present invention overcomes the problems caused by the thermal cycling by utilizing an encapsulant that has substantially the same coefficient of thermal expansion as cup 24. In addition, the delamination problems are substantially reduced by an encapsulant layer that is constructed from the same base material as the cup. Here, two materials will be said to have the same base material if the materials belong to a similar family of compounds or polymers and have similar chemical composition and thermal coefficients of expansion. Small amount of additives may be added to the base material composition such as diffusing particles, fillers, stabilizers and phosphors. For example, a cup constructed from a molded epoxy is filled with an epoxy encapsulant in one embodiment. Similarly, a cup constructed from a silicone material is filled with a silicone encapsulant in another embodiment. In the case of an encapsulant that is augmented with phosphor particles or the like, the thermal coefficient of expansion of the encapsulant layer may not exactly match the thermal coefficient of expansion of the cup. Similarly, the cup material can include particulates or other materials to render the cup reflective, and hence, the cup may also have a somewhat different thermal coefficient of expansion relative to the encapsulant layer. However, the differences in coefficients of thermal expansion are substantially less than those encountered when different base materials are utilized for the two components, and hence, the present invention provides a significant improvement.

Figure 2:
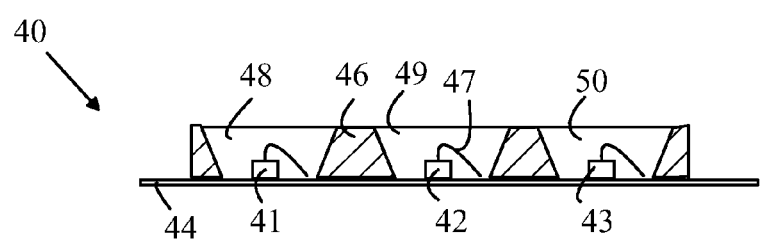
FIG. 2 is a cross-sectional view of a multi-LED package.
Figure 3:
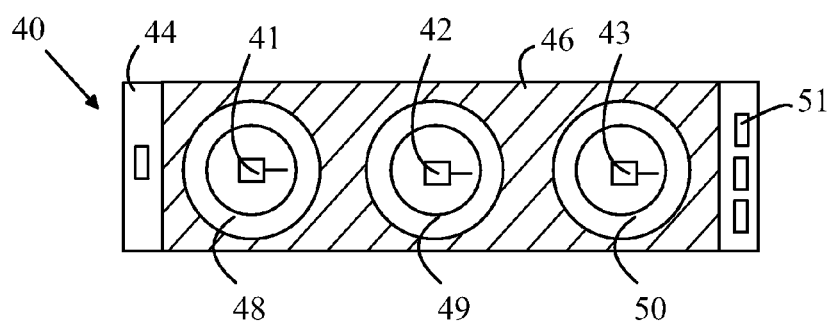
FIG. 3 is a top view of the multi-LED package shown in FIG. 2.

The embodiments discussed above utilize a lead frame system. However, embodiments based on other forms of packaging can also be utilized. Refer now to FIGS. 2 and 3. FIG. 2 is a cross-sectional view of a multi-LED package, and FIG. 3 is a top view of that multi-LED package. Package 40 includes three LEDs shown at 41-43 that are attached to a substrate 44. Substrate 44 is an insulating substrate having a plurality of conducting traces that terminate in pads 51 for providing connections between the LEDs and external circuit driving circuits. The number of such pads and traces depends on the particular circuit configuration, the number of LEDs, and other design criteria. The LEDs are connected to the conducting traces by wire bonds 47 and/or conducting pads on the bottom of the LED dies. The LEDs are located in reflecting cups such as cups 48-50 formed in layer 46 having an inner surface that is typically coated with a highly reflective material such as Al or layer 46 can include white particles that render the walls white thus providing a reflector with a matte finish.

As discussed above, the interior of the cup is typically filled with an encapsulating material that protects the LEDs and any wire bonds. Layer 46 is constructed from the same base material as the encapsulant. For example, layer 46 can be constructed from a sheet of silicone in which holes have been molded to provide the reflector walls. The cups are then filled with silicone after the dies have been attached. In another embodiment, layer 46 is constructed from epoxy and the cups are filled with an epoxy that is cured in place.

For many applications, the preferred base material is a flexible silicone. Since the cup layer and encapsulant will have substantially the same coefficients of thermal expansion in this case, only the differences between the thermal expansion coefficient of the underlying carrier and the silicone components need be accommodated. Since layer 46 and the encapsulant material are flexible, these differences in thermal coefficient of expansion can be accommodated by small deformations in layer 46 and the encapsulant layer.

Figure 4:
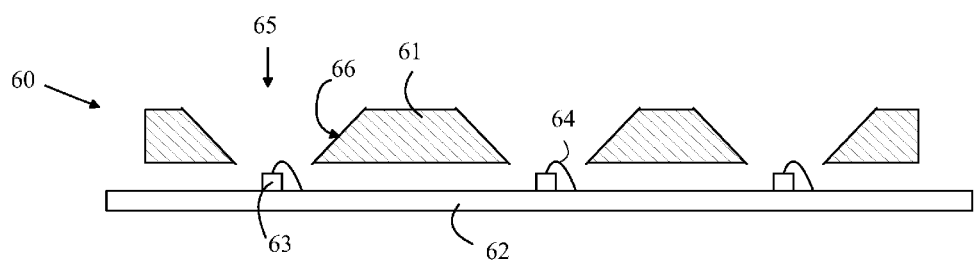
FIG. 4 is a cross-sectional view of a portion of a light source according to one embodiment of the present invention prior to the attachment of the reflective layer.

The reflector layer can be applied to the carrier as a separate component or molded in place on the carrier. Refer now to FIG. 4, which is a cross-sectional view of a portion of a light source according to one embodiment of the present invention prior to the attachment of the reflective layer. Light source 60 is constructed from a reflector layer 61 that is molded separately and then attached to circuit carrier 62. Reflector layer 61 is molded from a flexible compound such as silicone and includes holes such as hole 65 having reflective walls 66. The LED dies 63 can be attached to circuit carrier 62 and electrically connected to circuit carrier 62 prior to the attachment of reflector layer 61. In the example shown in FIG. 4, the LEDs are connected to one trace that is under die 63 and one trace that is connected to the die by a wire bond such as wire bond 64. The reflector layer could be bonded to the circuit carrier by a silicone-based cement in this embodiment. After the reflector layer is bonded to circuit carrier 62, the reflective cups can be filled with the appropriate encapsulant.

In another embodiment, the reflector layer is connected to the circuit carrier prior to the attachment of the die to the circuit carrier. The reflective cups have sufficient space to allow the dies to be attached and wire bonded by accessing the circuit carrier through the reflective cup. After the dies have been connected, the reflective cups are filled with the corresponding encapsulant as discussed above.

Figure 5:
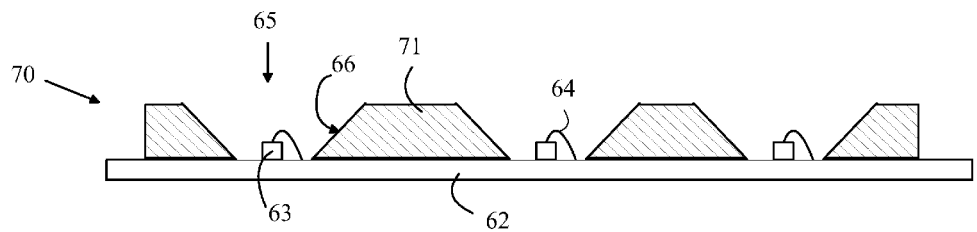
FIG. 5 is a cross-sectional view of a portion of a light source according to another embodiment of the present invention.

Alternatively, the reflector layer could be molded in place over the carrier. Refer now to FIG. 5, which is a cross-sectional view of a portion of a light source according to another embodiment of the present invention. Light source 70 is similar to light source 60 discussed above. However, light source 70 includes a reflector layer 71 that is molded onto circuit carrier 62. The layer can be molded either before or after the LEDs are attached and connected to circuit carrier 62.

A light source according to the present invention can be constructed in a manner analogous to construction of a multi-LED light source such as the light sources discussed above with reference to FIGS. 2 and 3. After a sheet of light sources has been fabricated, the individual light sources containing a predetermined number of LEDs are then separated from the sheet by cutting the sheet between the sources.

The above-described embodiments of the present invention utilize reflectors with reflective walls. For the purposes of this discussion, a reflector wall is defined as being reflective if that wall reflects more than 80 percent of the light generated in said LED and any luminescent conversion material that strikes that wall.

The above-described embodiments utilize reflectors made from flexible materials. For the purposes of this discussion, the layer of material having the cavities that become the reflectors will be defined as being flexible if the material distorts sufficiently to accommodate differences in the thermal coefficient of expansion between the underlying circuit carrier and the reflector and the encapsulant layer and the reflector without distorting the encapsulant or causing the encapsulant and reflector to separate from one another.

Various modifications to the present invention will become apparent to those skilled in the art from the foregoing description and accompanying drawings. Accordingly, the present invention is to be limited solely by the scope of the following claims.

What is claimed is:

1. A light source comprising:
   a body;
   a lead frame at least partially encapsulated in the body;
   a die comprising an LED, the LED being electrically and thermally connected to the lead frame; and
   a cup comprising a recess in the body overlying the lead frame and filled with an encapsulant material, the die being located within the cup and being encapsulated by the lead frame and the encapsulant material;
   wherein the cup and the encapsulant material comprise a flexible base material, the flexible base material being the same for both the cup and the encapsulant material, and wherein the cup comprises reflective sidewalls positioned to reflect light leaving the die.

2. The light source of claim 1 wherein the cup, the encapsulant, and the body comprise a flexible base material having substantially the same coefficient of thermal expansion.

3. The light source of claim 1, wherein the cup has substantially the same coefficient of thermal expansion as the encapsulant material.

4. The light source of claim 1 wherein the encapsulant material comprises a medium having an index of refraction that is intermediate between that of air and the index of refraction of the die.

5. The light source of claim 1 wherein the flexible base material comprises a flexible silicone.

6. The light source of claim 1 wherein the cup comprises white side walls.

7. The light source of claim 1 wherein the encapsulant comprises a curved top surface.

8. A light source comprising:
   a molded body;
   a lead frame at least partially encapsulated in the molded body;
   a die comprising an LED, the LED being electrically and thermally connected to the lead frame, wherein the lead frame is configured to provide power and heat dissipation to the die;
   a cup comprising a recess in the molded body overlying the lead frame and filled with an encapsulant material, the die being located within the cup and being encapsulated by the lead frame and the encapsulant material; and
   wherein the molded body and the encapsulant material comprise a flexible base material, the flexible base material being the same for both the molded body and the encapsulant material, wherein the molded body has substantially the same coefficient of thermal expansion as the encapsulant material, and wherein the cup comprises reflective sidewalls positioned to reflect light leaving the die.

9. The light source of claim 8, wherein the cup comprises white sidewalls positioned to reflect light leaving the die.

10. The light source of claim 8, wherein the cup comprises particulates that render the cup reflective.

11. The light source of claim 8, wherein the cup comprises a reflective, flexible material.

12. The light source of claim 8, wherein the cup comprises an inner surface that includes white particles that render the sidewalls of the cup reflective.

13. The light source of claim 8, wherein the cup comprises an inner surface coated with $TiO_2$.

14. The light source of claim 8, wherein the encapsulant comprises wavelength converting material that alters the spectrum of light emitted by the LED.

15. The light source of claim 8, wherein the encapsulant comprises suspended wavelength converting particles that convert a portion of the light emitted from the LED to light of a different color.

16. A light source comprising:
   a substrate,
   a body on the substrate;
   a lead frame at least partially encapsulated by the body and the substrate;
   a die comprising an LED, the LED being electrically and thermally connected to the lead frame, wherein the lead frame is configured to provide power and heat dissipation to the die; and
   a cup comprising a recess in the body overlying the lead frame and filled with an encapsulant material, the die being located within the cup and being encapsulated by the lead frame and the encapsulant material, wherein the cup comprises reflective sidewalls positioned to reflect light leaving the LED;
   wherein the body, the substrate and the encapsulant material comprise a flexible base material, the flexible base material being the same for the body, the substrate and the encapsulant material, wherein the body and the substrate have substantially the same coefficient of thermal expansion as the encapsulant material, wherein the encapsulant material comprises a wavelength converting material that alters the spectrum of light emitted by the LED, and wherein the encapsulant material comprises a curved top surface.

17. The light source of claim 16, wherein the cup comprises white sidewalls positioned to reflect light leaving the LED.

18. The light source of claim 16, wherein the cup comprises particulates that render the cup reflective.

19. The light source of claim 16, wherein the cup comprises a reflective, flexible material.

20. The light source of claim 16, wherein the cup comprises an inner surface that includes white particles that render the white sidewalls of the cup reflective.

21. The light source of claim 16, wherein the cup comprises an inner surface coated with $TiO_2$.

* * * * *